United States Patent
Van Geloven et al.

(10) Patent No.: US 8,143,705 B2
(45) Date of Patent: Mar. 27, 2012

(54) TAMPER-RESISTANT SEMICONDUCTOR DEVICE AND METHODS OF MANUFACTURING THEREOF

(75) Inventors: Johannes A. J. Van Geloven, Eindhoven (NL); Pim T. Tuyls, Mol (BE); Robertus A. M. Wolters, Eindhoven (NL); Nynke Verhaegh, Arnhem (NL)

(73) Assignee: NXP B.V., Eindhoven (NL)

( * ) Notice: Subject to any disclaimer, the term of this patent is extended or adjusted under 35 U.S.C. 154(b) by 240 days.

(21) Appl. No.: 12/671,067

(22) PCT Filed: Jul. 29, 2008

(86) PCT No.: PCT/IB2008/053047
§ 371 (c)(1),
(2), (4) Date: Jan. 28, 2010

(87) PCT Pub. No.: WO2009/016589
PCT Pub. Date: Feb. 5, 2009

(65) Prior Publication Data
US 2010/0187527 A1      Jul. 29, 2010

(30) Foreign Application Priority Data
Aug. 2, 2007 (EP) .................................... 07113706

(51) Int. Cl.
*H01L 29/40*      (2006.01)
(52) U.S. Cl. .... 257/621; 257/48; 257/698; 257/E23.141
(58) Field of Classification Search .................... 257/48, 257/621, 698, E23.141
See application file for complete search history.

(56) References Cited

U.S. PATENT DOCUMENTS

| | | | |
|---|---|---|---|
| 5,406,630 A | 4/1995 | Piosenka et al. | |
| 6,895,509 B1 | 5/2005 | Clark | |
| 2001/0033012 A1 | 10/2001 | Koemmerling et al. | |
| 2002/0002683 A1 | 1/2002 | Benson et al. | |
| 2004/0212017 A1 | 10/2004 | Mizuno et al. | |

FOREIGN PATENT DOCUMENTS

| | | |
|---|---|---|
| EP | 0 313 967 A | 5/1989 |
| WO | 03/046802 A2 | 6/2003 |
| WO | 03/061004 A | 7/2003 |

OTHER PUBLICATIONS

Li, Xiujun, et al, "A Smart and Accurate Interface for Resistive Sensors", IEEE Transaction on Instrumentation and Measurement; vol. 50, No. 6; Dec. 2001: pp. 1648-1651.
Van Der Pauw, L. J. "A Method of Measuring Specific resistivity and Hall Effect of Discs of Arbitrary Shape"; Philips Research Reports 13; p. 1-10; Feb. 1958.
Van Der Pauw, L. J.; "A Method of Measuring the Resistivity and Hall Coefficient on Lamellae of Arbitrary Shape"; Philips Technical Review 20: pp. 220-224; 1958.

*Primary Examiner* — Tan N Tran

(57) ABSTRACT

The invention relates to a tamper-resistant semiconductor device comprising a substrate (5) comprising an electronic circuit arranged on a first side thereof. An electrically-conductive protection layer (50, 50a, 50b) is arranged on a second side of the substrate (5) opposite to the first side. At least three through-substrate electrically-conductive connections (45) extend from the first side of the substrate (5) into the substrate (5) and in electrical contact with the electrically-conductive protection layer (50, 50a, 50b) on the second side of the substrate (5). A security circuit is arranged on the first side connected to the through-substrate electrically-conductive connections (45) and is arranged for measuring at least two resistance values (R12, R23, R34, R14, R13, R24) of the electrically-conductive protection layer (50, 50a, 50b) through the through-substrate electrically-conductive connections (45). The security circuit is further arranged for comparing the measured resistance values (R12, R23, R34, R14, R13, R24) with reference resistance values.

21 Claims, 10 Drawing Sheets

TAMPER-RESISTANT SEMICONDUCTOR DEVICE AND METHODS OF MANUFACTURING THEREOF

FIELD OF THE INVENTION

The invention relates to a tamper-resistant semiconductor device and to methods of manufacturing such a device.

BACKGROUND OF THE INVENTION

Integrated circuits (IC's) for applications such as smartcards, RFID tags, Pay-TV chips often contain a secret security key and carry out secret functions. The IC needs to be secure against attacks from the outside which aim at retrieving data there from. IC's may be subjected to both front-side as well as backside attacks. In this description the "front-side" of a semiconductor device is defined as the side of the semiconductor device on which circuitry is provided. This side is also being referred to as the "first side of the substrate" in this description. Likewise, the "backside" of the semiconductor device is defined as the side opposite to the front-side and this side is also being referred to as the "second side of the substrate" in this description. Backside attacks may consist of various analysis techniques such as light or photon emission detection, thermal infrared detection, liquid crystal detection, voltage or electric field detection, and electro magnetic detection methods. Often these methods are used in combination with invasive attacks such as wafer thinning, laser cutting and heating, focused ion beam (FIB) techniques. Also light or laser flash methods are used from the backside in order to force signals to flip. When any one of the above-mentioned techniques is used in combination with mathematical attacks, these attacks can be very powerful. Because a lot of the earlier-mentioned techniques are done from the backside of the IC, it is essential that the backside of these IC's are well protected.

WO 03/046802 A2 discloses a semiconductor device comprising a circuit that is covered by a passivation layer. It is provided with a first security element that comprises a local area of the passivation layer and which has a first capacitance. Preferably, a plurality of security elements is present, having different capacitances. The semiconductor device further comprises measuring means for measuring an actual value of the first capacitance, and a memory comprising a first memory element for storing the actual value as a first reference value in the first memory element. The semiconductor device of the invention can be initialized by a method wherein the actual value of the capacitance is stored as the first reference value. An attempt to tamper the passivation layer can be detected by comparison of the actual value measured again and the first reference value.

A disadvantage of the known semiconductor device is that it does not provide for backside protection. Moreover, the protection technique implemented in this device may not easily be manufactured using conventional backside processing techniques, as it requires a special passivation structure comprising a special passivation layer and measurement electrodes for measuring a capacitance or inductance whose values are determined by the passivation layer. For backside processing this constitutes quite a complex solution.

SUMMARY OF THE INVENTION

It is an object of the invention to provide a semiconductor device of the kind set forth in the opening paragraph which comprises backside protection which may be easily manufactured using conventional backside processing techniques.

The invention is defined by the independent claims. The dependent claims define advantageous embodiments.

In a first aspect, the invention relates to a tamper-resistant semiconductor device comprising:
  a substrate comprising an electronic circuit arranged on a first side thereof; an electrically-conductive protection layer arranged on a second side of the substrate opposite to the first side;
  at least three through-substrate electrically-conductive connections extending from the first side of the substrate into the substrate and in electrical contact with the electrically-conductive protection layer on the second side of the substrate;
  a security circuit being arranged on the first side connected to the through-substrate electrically-conductive connections and being arranged;
i) for measuring at least two resistance values of the electrically-conductive protection layer through the through-substrate electrically-conductive connections to provide a security code, and
ii) for comparing the security code with a reference code.

The effect of the features of the semiconductor device according to the invention is that a backside protection of the semiconductor device is achieved, which may be easily manufactured using conventional backside processing techniques.

First of all, the electrically-conductive protection layer may be easily provided on backside by means of conventional processing techniques. If not desired, no patterning of the protection layer is needed. However, patterning of the protection layer in a relative low resolution is evidently not excluded. The protective layer could be applied, for instance, with a printing technique. It is an important insight of the invention that the protective layer, which forms the basis for the resistance measurements, is electrically conductive. More specifically, it is more electrically conductive than the substrate on which it is applied. This substrate is usually a semiconductor substrate, though another substrate such as glass or ceramic is principally not excluded. Most suitably, with a silicon semiconductor substrate the region of the substrate adjacent to the protection layer is suitably lowly doped (n-) or (p-), or even given a higher resistivity by implantation or irradiation.

Second, the semiconductor device according to the invention provides for a resistive protection scheme which in combination with the through-substrate connections enables front-side measurement of backside properties (of the protection layer). This allows a more precise measurement, due to the presence of many circuits. Moreover, the length of the through-substrate connection is effectively short and could be relatively direct, such that the path from measurement circuit to protective layer is short. This prevents that a measurement is biased by interactions within the interconnect structure of the integrated circuit, which interactions and effects are largely the same for any connection. Furthermore, the use of the circuit at the front-side allows that some resistors or other impedances are defined at the front side. This provides an additional manner to enhance the security level of the security codes.

Third, the through-substrate electrically-conductive connections may be manufactured without difficulty in most IC processes and provide a very convenient electrical contact to the resistive protection layer. The through-substrate connections may be conveniently manufactured before the backside processing starts. By doing so a contact between the electrically-conductive protection layer and the electrically-conductive through-substrate connections may be automatically achieved.

Fourth, providing at least three electrical connections enables the possibility of measuring different resistance values on a single one-piece protection layer, whereas in the prior art complexly patterned protection layers are manufactured for providing a plurality of different resistances. Such measurement of different resistance values allows the generation of a plurality of security codes. As such, it allows that the security circuit defines which specific security code is to be measured. This possible variation in security codes strongly enhances the security level: even if a unauthorized person would be able to detect a resistance value adequately, it is not clear how to copy the security code. Though the generation of a security code is in line with the expectations in the identification industry, it is not excluded that the security code comprises merely the set of measured values, which are compared one by one or subsequently with reference values. The security code may be stored on-chip, in a memory, or alternatively in a central database external to the semiconductor device.

In an embodiment of the semiconductor device according to the invention the number of through-substrate connections equals n, n≧3, and the number of resistance values measured between pairs of the through-substrate connections equals Z, wherein Z complies with the following equation:

$$2 < Z \leq (n!/((n-2)!*2!)).$$

The more through-substrate connections are made to the semiconductor device, the more resistance values can be measured from the protection layer. In case of 2-point resistance measurements the formula above gives the range of possible resistance values.

Suitably, the security circuit defines an instruction of a plurality of measurements under specific conditions and possibly a subsequent signal processing to define the security code. This instruction may be encrypted with hash-functions and the like. Specific conditions of measurement include for instance the choice of the resistance, the voltage applied over the resistance, the type of resistance measurement and the manner of application of a voltage. One option of voltage application is the provision of a voltage sweep, another option is the provision of a continuous voltage. With a voltage sweep, a possible manner of measurement is the measurement of the delay in time. Suitably, one applies direct current. However, alternating current is not excluded. Measurement of the resistance in one direction followed by the measurement in the opposite direction is not excluded either. The latter is a manner to detect any hysteresis effects. These could be used to create an enhanced security level.

In one embodiment, the resistance is measured as a two-point connection. In an alternative embodiment, a multi-point resistance measurement is carried out. It is not excluded that the security circuit is arranged so as to enable both two-point and multi-point resistance measurements. In an embodiment of the semiconductor device according to the invention the security circuit comprises a circuit selected from the group comprising:

a two-point resistance-measurement circuit, and
a four-point resistance-measurement circuit.

These circuits constitute the most commonly used types for resistance-measurement. Various resistance-measurement techniques are known from the prior art. The above-mentioned circuits provide convenient solutions which may be used in the tamper-resistant semiconductor device according to the invention. An example of a four-point resistance-measurement technique is the Van-Der-Pauw measurement technique, which is well-known to the person skilled in the art.

All what needs to be done in the semiconductor device according to the invention is properly positioning the through-substrate connections with respect to the protection layer and measuring the resistance between possible combinations of them. The proper positioning is a design issue to generate a resistance value that is well measurable and allows sufficient variation between individual resistance values. This proper positioning for instance depends on the resistive material and the manner of application: as a coating or a part of a suspension etc. Furthermore, the proper positioning depends on the variation of distances between each through-substrate connections. Suitably, the design is made such that a first and a second through-substrate connection, which are neighbors to each other, are located at a first lateral distance from each other. The first and a third through-substrate connections, which are also neighboring, are however located at a second lateral distance from each other. This second lateral distance is different from the first lateral distance. The second distance is in the range of 20 to 80% with respect to the first distance, such as 0.8, 0.75, 0.67, 0.5, 0.33, 0.25 or any range between one or more of these ratios. It is preferred to define a limited number of distances between neighboring through-substrate connections. This is an optimum between the number of variations and a control over the resistance values. Particularly, it is an option to do a reference measurement of the resistance values measured between neighbors at the same lateral distance. Such reference measurement can be used for compensation, calibration or error correction as a consequence of temperature variations.

In one specific embodiment, a resistive measurement is done relative to another one that has the same sensitivity to ambient parameters, such as temperature. This allows to rule out effects of the ambient parameters, and thus to ensure that the sensitivity to ambient parameters of all resistances, measured from the same protection layer, is substantially the same.

In an embodiment of the semiconductor device according to the invention the electrically-conductive protection layer is opaque for at least infrared and visible light. This measure provides for a higher security level, because optical inspection methods from the backside are rendered impossible without removing the protection layer. However, that attempt would result in a change in the detected resistance, which may be used to clear the secure contents in the electronic circuit. Alternatively, it may be used to deactivate or reset the electronic circuit.

In an embodiment of the semiconductor device according to the invention the substrate comprises an SOI-substrate, the SOI-substrate comprising a semiconductor substrate layer, a buried insulating layer provided on the substrate layer, and an active layer provided on the buried insulating layer, the active layer being located at the first side of the substrate and the semiconductor substrate layer being located at the second side of the substrate. The electronic circuit is then provided in the active layer. The through-substrate connections extend from the first side through the active layer and the buried insulating layer to the semiconductor substrate layer. The electrically-conductive protection layer is provided on the semiconductor substrate layer at the second side of the substrate. The buried insulating layer is usually an oxide layer, but could be a nitride, oxynitride or other alternatively.

One advantage of this embodiment is that it allows for a higher resolution of the through-substrate connections. In this embodiment the through-substrate connections only need to extend from the first side to the substrate layer which means that the through-substrate connections (vias) may be shorter. Given a specific process, the maximum achievable depth of an opening (needed for the manufacturing of a through-substrate connection) depends on the aspect ratio of the opening, wherein the aspect ratio is defined as the depth of the opening divided by the minimum lateral dimension of the opening. A shallower opening may have a smaller lateral dimension, which may result in a chip area reduction, and indirectly a cost saving.

Another advantage is the envisaged improved reliability with a simplification of manufacture. There is no need to provide a galvanic contact from the through-substrate connections to the protective layer. Nevertheless, the creation of a path through one or more of the higher doped regions of the substrate is prevented with the buried insulating layer.

The absence of galvanic contacts simplifies the thinning operation, since thinning of a composite of two materials—substrate and connection—may lead to differences in thinning speed. Such differences in thinning speed may be detrimental to reliability, as exposed connections during thinning may lead to reduced adhesion, contamination of the circuit through the connections, and even cracking of the connection.

In one specific embodiment of the SOI-substrate, the substrate does not need to be thinned down as much as in the case of bulk substrates. So this may be very beneficial in applications where the substrate does not need to be thinned down (e.g. to smart card dimensions). For smart card dimensions thinning usually extends to 30 microns or less. For ordinary applications, the overall thickness of the substrate may be more, in the order of 100-200 microns. It will be clear that it is most suitable that the semiconductor substrate layer is relatively high-ohmic and preferably not doped with charge carriers. Specific ohmic values or charge carrier concentrations will be clear to the skilled person.

Use of an SOI substrate is not only beneficial for the manufacture of the security circuit of the invention. It also allows the integration of the security ciruit into devices for applications in which security is not considered a key issue so far, as in identification applications. An example is a high-voltage circuit for automotive applications. It is observed that the buried insulating layer does not need to extend throughout the semiconductor device. E.g. it could be a locally defined SOI.

In an embodiment the substrate is mounted at its second side on an electrically-conductive substrate carrier via an electrically-conductive adhesive layer, wherein the electrically-conductive substrate carrier and the electrically-conductive adhesive layer together form the electrically-conductive protection layer. IC's are generally mounted in a package. Such a package comprises a substrate carrier (e.g. a leadframe) onto which the semiconductor device is mounted with an adhesive layer, whereafter the semiconductor device is connected to the substrate carrier. The last-mentioned embodiment is advantageous because the substrate carrier and the adhesive layer are effectively reused as protection layer. An attempt to remove the semiconductor device from the substrate carrier will directly affect the resistances measured by the security circuit, which event on its turn may be used to erase the secret data stored in the electronic circuit.

In an embodiment of the semiconductor device according to the invention the electrically-conductive protection layer and the through-substrate connections form a region covering a part of the second side of the substrate. Therewith, the invention allows to protect specific areas of the device particularly. Such specific protection is first of all an optical protection. However, it may well be that a circuit block overlying the defined region may be switched off once tampering of the protection layer or the connections is detected. Herein, the region may be defined by patterning of the protection layer, but also through positioning of the connections.

In a further modification, the protection layer is patterned, while spaces on the second side that are not covered with the protection layer may be used for other purposes like backside contacting of the integrated circuit. More specifically, through-substrate connections are defined as well outside the said region, so as to enable signal transmission or grounding of the circuit.

In an embodiment of the semiconductor device according to the invention the electrically-conductive protection layer fully covers the second side of the substrate. An advantage of this embodiment is that is provides for a very simple solution, which is easy to manufacture. The only processing step required on the second side of the substrate is the deposition of the electrically-conductive protection layer, which may be done by means of sputtering for example.

In an embodiment of the semiconductor device according to the invention the electrically-conductive protection layer comprises a material selected from a group comprising: aluminum (Al), titanium-tungsten (TiW), titanium-nitride (TiN), tantalum-nitride (TaN), and all possible combinations of any one of these materials. These materials are advantageous because of their compatibility with most processing techniques.

In an embodiment the semiconductor device further comprises storage means for storing the reference resistance values and for providing the reference resistance values to the security circuit. Before the semiconductor device according to the invention is used in its application the reference resistance values may be measured and conveniently stored in the storage means of this embodiment. Any attempt to tamper the protection layer in order to retrieve data from the electronic circuit device will result in a change in the resistances measured by the security circuit. These resistances may be compared with the reference resistances, which event on its turn may be used to erase the secret data stored in the electronic circuit in case of a detected change, or alternatively reset or deactivate the electronic circuit.

In an embodiment of the semiconductor device according to the invention the electronic circuit comprises a non-volatile memory for storing data to be protected. Non-volatile memories like PROM, EPROM, EEPROM, and FLASH memories are particularly vulnerably to external attacks and greatly benefit from the tamper-resistance as provided by the invention. In a further embodiment of the semiconductor device according to the invention the device further comprises resetting means for erasing contents of the non-volatile memory in response to a measured resistance change of the electrically-conductive protection layer. Any attempt to tamper the protection layer in order to retrieve data from the electronic circuit device may be detected and used to trigger the resetting means for erasing the contents of the non-volatile memory.

In an embodiment of the semiconductor device according to the invention the electrically-conductive protection layer comprises a composition or material which provides for a pseudo-random or fully-random variable spatial conductivity. This embodiment is advantageous, because of a higher protection level which is achieved by it. The variability of the conductivity of the protection layer renders the determination of its conductivity as seen from the through-substrate connections very difficult. A higher variability results in a higher security level. In a further embodiment of the semiconductor device according to the invention the variability of the electrically-conductive protection layer is used to extract an irreproducible device-specific key. When the variability of the conductivity of the protection layer is large, the measured resistance values together may advantageously form a device-specific key. This key may be used for encryption purposes which brings the security level to even a higher level.

Preferably, in the two last mentioned embodiments, the electrically-conductive protection layers comprises a mixture of tin (Sn) and aluminum (Al) which results in a large variability of the conductivity.

In case a hacker, despite all measures, would be capable of retrieving and reproducing the electrical and physical properties of the protection layer, he might circumvent the protection in the semiconductor device according to the invention. In that case a very advantageous embodiment of the semiconductor device is obtained if the through-substrate electrically-conductive connections have distributed or random conductivity. In that embodiment the hacker would be still faced with the problem that the resistance measured by the security circuit is still unknown. In case the hacker desires to use measured properties from one semiconductor device on another device the circumvention still fails and thus a higher protection level is obtained.

In an embodiment the semiconductor device further comprises at least one light-emitting device and at least one light-sensing device provided on the first side of the semiconductor device, wherein the light-emitting device is arranged to emit light, including a wavelength range for which the substrate is transparent, into the substrate towards the second side; and wherein the light-sensing device is arranged to sense at least a fraction of the emitted light following passage through the substrate and reflection at the second side, and configured to output a signal indicative of a reflecting state of the second side, thereby enabling detection of an attempt to tamper with the second side of the semiconductor device.

This embodiment constitutes a tamper-resistance semiconductor device in which two the protection schemes in accordance with the invention is combined with an optical protection scheme. An hacker might be able to determine the resistance values measured by the security circuit, and reproduce the same resistances on the second side between the through-substrate connections. In this embodiment, however, the hacker is still faced with the problem that the absence of the protection layer which also acted as a reflection layer is detected by the light-sensing device, and that the contents of the electronic may still be erased after this detection.

In a second aspect the invention relates to methods of manufacturing such a tamper-resistant semiconductor device which benefit from the same advantages as the semiconductor device itself. In a first main embodiment this method comprises steps of:

providing the substrate having the first side and the second side opposite to the first side;

providing the electronic circuit on the first side of the substrate; providing the at least three through-substrate electrically-conductive connections in the substrate, the connections extending from the first side of the substrate to the second side of the substrate, and providing the security circuit on the first side, and connecting the circuit to the through-substrate electrically-conductive connections, the security circuit being arranged;

i) for measuring at least two resistance values of the electrically-conductive protection layer through the through-substrate electrically-conductive connections, and ii) for comparing the measured resistance values with reference resistance values providing the electrically-conductive protection layer on the second side of the substrate.

This embodiment of the method conveniently provides a tamper-resistant semiconductor device. Bulk substrates are widely used. SOI substrates are much more expensive and will be used for requisite devices only.

In a second main embodiment the method according to the invention comprises steps of:

providing a SOI-substrate, the SOI-substrate comprising a semiconductor substrate layer, a buried-oxide layer provided on the substrate layer, and an active layer provided on the buried-oxide layer, the active layer being located at the first side of the substrate and the semiconductor substrate layer being located at the second side of the substrate;

providing the electronic circuit on the first side of the substrate in the active layer;

providing the at least three through-substrate electrically-conductive connections in the substrate, the connections extending from the first side of the substrate to the semiconductor substrate layer, and providing the security circuit on the first side, and connecting the circuit to the through-substrate electrically-conductive connections, the security circuit being arranged;

i) for measuring at least two resistance values of the electrically-conductive protection layer through the through-substrate electrically-conductive connections, and ii) for comparing the measured resistance values with reference resistance values providing the electrically-conductive protection layer on the second side of the substrate.

This embodiment of the method is very advantageous, because it relies upon the fact that the substrate layer of an SOI substrate is generally a fairly good conducting layer. The through-substrate connections therefore need not be extending completely through the substrate to the protection layer. An extension towards the substrate layer establishes a connection between the through-substrate connections. The resistance which is measured from the first side of the semiconductor device comprises some sort of parallel connection of the substrate-layer resistance and the protection layer resistance. It must be noted that the lower the resistance of the protection layer with respect to the resistance of the substrate layer, the more a tampering of the protection layer will influence the measured resistance.

These and other aspects of the invention are apparent from and will be elucidated with reference to the embodiments described hereinafter.

BRIEF DESCRIPTION OF THE DRAWINGS

In the drawings:

FIG. 1b shows a schematical top-view of the tamper-resistant semiconductor device of FIG. 1a;

DETAILED DESCRIPTION OF THE PREFERRED EMBODIMENT

Figure 1A:
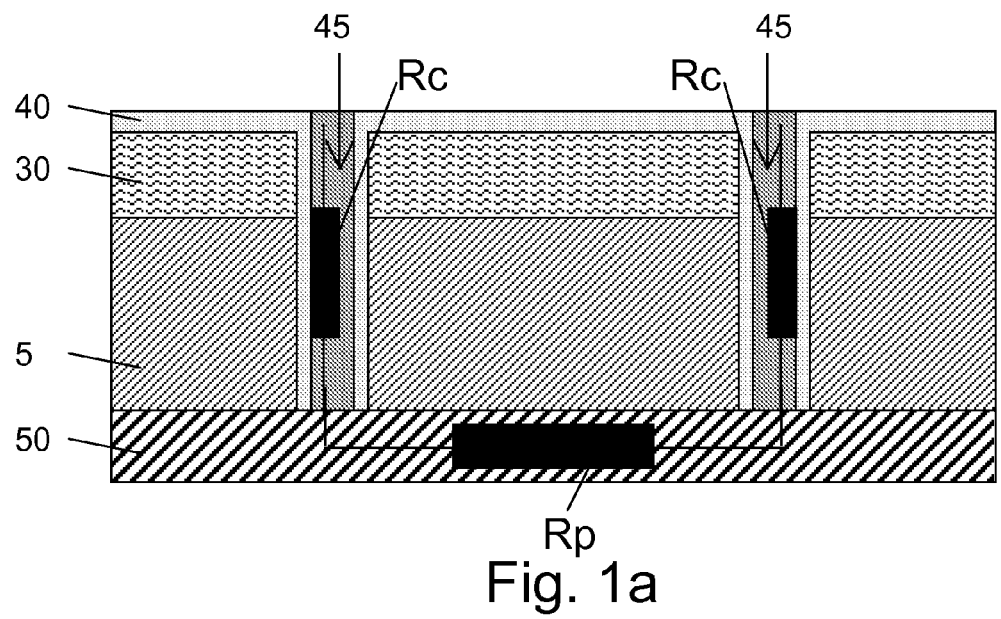
FIG. 1a shows a tamper-resistant semiconductor device according to a first embodiment of the invention.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage. Throughout the Figures, similar or corresponding features are indicated by same reference numerals or labels.

Protection of integrated circuit (IC's) against attacks from the backside are a necessity in secure-IC applications. The inventors have identified a need for an industry-wide solution for this problem. The invention provides for a highly counterfeit-proof solution as will be discussed more elaborately later in this description. In short the solution is provided by means of shielding the backside of the IC with a protection layer which shields for various attacks and evaluation methods while at the same time offering a possibility for attack detection.

In this description the "front-side" of a semiconductor device is defined as the side of the semiconductor device on which circuitry is provided. This side is also being referred to as the "first side of the substrate" in this description. Likewise, the "backside" of the semiconductor device is defined as the side opposite to the front-side and this side is also being referred to as the "second side of the substrate" in this description.

FIG. 1a shows a tamper-resistant semiconductor device according to a first embodiment of the invention. This Figure shows a semiconductor substrate 5. The substrate 5 may comprise any one of the following semiconductor materials and compositions like silicon (Si), germanium (Ge), silicon germanium (SiGe), gallium-arsenide (GaAs) and other III-V compounds like indium-phosphide (InP), cadmium sulfide (CdS) and other II-VI compounds, or combinations of these materials and compositions. The substrate 5 may comprise at its front-side elements, e.g. transistors, capacitors, resistors, diodes, and inductors, which form the components of an electronic circuit. In the Figures, the elements have been left out in order to facilitate the understanding of the invention. The elements are covered with an insulating layer 30. The insulating layer 30 may comprise materials like silicon oxide ($SiO_2$), silicon nitride ($Si_3N_4$) and low-k dielectrics (Si Low K (SiLK), hydrogen silsesquioxane (HSQ), siliconoxicarbide/Black Diamond (SiOC)) and all possible combinations of any one of these materials. The semiconductor device further comprises through-substrate electrically conductive connections 45 that extend from the front-side through the insulating layer 30 and the substrate 5 to the backside of the substrate 5. In subsequent referencing to these connections 45, the fact that they are electrically conductive will be omitted for brevity reasons. Further, the through-substrate connections 45 are isolated from the substrate 5 by means of a further electrically insulating layer 40. Preferably, the through-substrate connections 45 may comprise materials like aluminum (Al), tungsten (W), Copper (Cu) with a tantalum-nitride (TaN) barrier layer, and doped poly crystalline Si. On the backside of the substrate 5 an electrically-conductive protection layer 50, that, in some embodiments, is opaque for infrared and visible light, is provided. In subsequent referencing to the protection layer 50, the fact that it is electrically-conductive is sometimes left out for brevity reasons.

In the invention the protection layer 50 may comprise materials like low temperature (<450° C.) back end compatible electrically conductive coating materials like a metal. The electrically-conductive protection layer 50 preferably comprises materials that are compatible with standard CMOS processing, for example a material selected from a group comprising: aluminum (Al), tungsten (W), copper (Cu), titanium-tungsten (TiW), titanium-nitride (TiN), tantalum-nitride (TaN), and all possible combinations of any one of these materials. In some embodiments the protection layer 50 may be isolated from the substrate 5, but this is not essential. It is more important (but still not essential) for a proper functioning of the semiconductor device that the through-substrate connections 45 are properly isolated from the substrate 5 such that the current-path between the connections 45 is close to the backside of the substrate 5. A desired effect of the electrically conductive protection layer 50 is that it shields the IC for attacks and evaluation from the backside. In embodiments where the protection layer 50 is opaque, optical detection methods are prevented by the opaqueness of the protection layer 50. Invasive methods like focused-ion-beam are blocked because of the fact that the protection layer 50 is electrically conductive. Electrically charged-beams difficulty pass an electrically conductive layer and possible reflections are heavily disturbed.

On the front-side of the substrate 5 a security circuit (not shown) is provided being connected to the through-substrate electrically-conductive connections 45 and being arranged;
i) for measuring at least two resistance values of the electrically-conductive protection layer 50 through the through-substrate electrically-conductive connections 45, and
ii) for comparing the measured resistance values with reference resistance values.

In FIG. 1a it is illustrated that any resistance measured on the front-side of the substrate 5 at least comprises the resistance Rc of the through-substrate connections 45 in series with the resistance Rp of the protection layer 50. There may be further parasitic resistances and capacitances, but these have been omitted for clarity reasons.

Whereas, in the prior art various protection schemes are known which make use of complexly patterned protection layer(s) which form a network of resistances, the tamper-resistant semiconductor device according to the invention excels in simplicity, because the protection layer 50 does not comprise complex patterns. Instead the protection layer 50 basically consists of "one piece" considered in a plane parallel to the substrate. It may have sub-layers of different materials. It may have any shape, as long as it covers that part of the IC which needs backside protection and as long as it does not have holes which have such size that they feature backside inspection therethrough. As far as the complexity is concerned, the most attractive embodiment of the semiconductor device according to the invention comprises a protection layer 50 which fully covers the backside of the substrate 5, because no lithography or other patterning techniques are then required on the backside, which simplifies the manufacturing process.

Figure 1B:
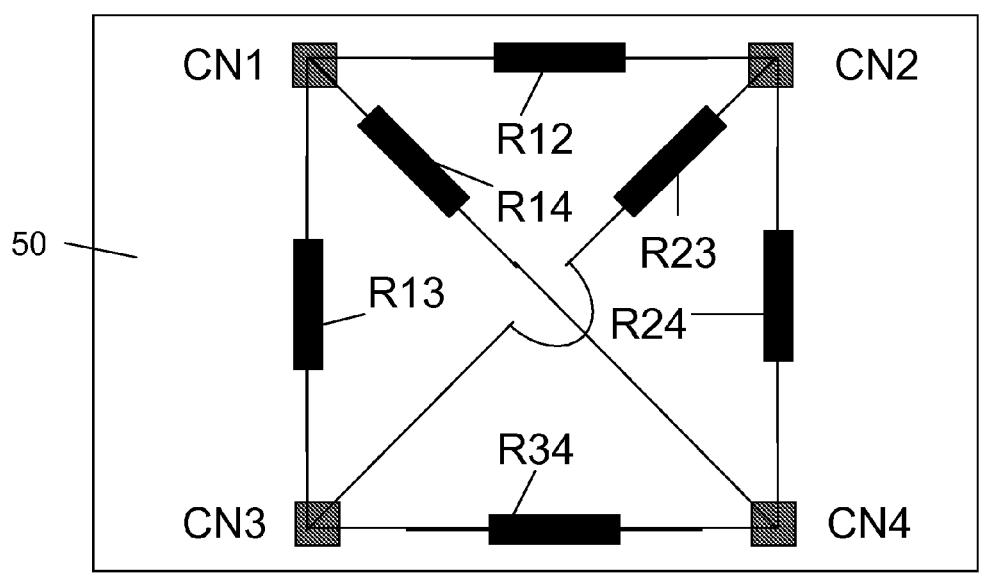

FIG. 1b shows a schematical top-view of the tamper-resistant semiconductor device of FIG. 1a. The inventors have realized that when at least three through-substrate connections 45 are provided to the protection layer 50 at least two resistance values may be measured from a single protection layer 5. The resistance value measured is at least determined by the shape of the protection layer 5 and the positions of the through-substrate connections 45. In FIG. 1b, by means of example four through-substrate connections CN1, CN2, CN3, CN4 are shown. In other embodiments it may be any number above two, because that enables the measurement of at least two resistance values. A first resistance value R12 may be measured between a first connection CN1 and a second connection CN2. A second resistance value R23 may be measured between the second connection CN2 and a third connection CN3. A third resistance value R34 may be measured between the third connection CN3 and a fourth connection CN4. A fourth resistance value R41 may be measured between the fourth connection CN4 and the first connection CN1. A fifth resistance value R13 may be measured between the first connection CN1 and the third connection CN3, and a sixth resistance value R24 may be measured between the second connection CN2 and the fourth connection CN4. In the example given in FIG. 1b so-called two-point resistance measurements are illustrated. Alternatively, 4-point resistance measurements or Van-Der-Pauw resistance measurements may be used. In that case more through-substrate connections 45 may be needed in order to facilitate the measurement of at least two resistance values. The measurement of resistance and what type of circuitry may be used for such measurement, is well-known to the person skilled in the art. In the following references more information is provided about various resistance measurement techniques:

Xiujun Li and G. C. M. Meijer, "A Smart and Accurate Interface for Resistive Sensors", IEEE Transactions on Instrumentation and Measurement, Vol. 50, No. 6, December 2001, p. 1648-1651;

Van Der Pauw, L. J. (1958). "A method of measuring specific resistivity and Hall effect of discs of arbitrary shape", Philips Research Reports 13: p. 1-9, and Van Der Pauw, L. J. (1958). "A method of measuring the resistivity and Hall coefficient on lamellae of arbitrary shape", Philips Technical Review 20: p. 220-224.

By contacting the protection layer 50 from the front-side by means of connections 45 that run through the substrate 5 it is possible to detect the presence of the protection layer 50 but also to measure its resistance. If the resistance measurements are done accurately enough it is also possible to detect if the protection layer 50 has been tampered with. Making of small holes and other tampering may then be detected. For instance a hole that is made in the protection layer 50 results in a change in one or more of the measured resistance values R12, R23, R34, R41, R12, R24. By measuring the resistances each time the semiconductor device starts up and comparing it with the value which has been measured and stored on the integrated circuit during production it is possible to take contra-attack measures, like erasing secure data in the electronic circuit (e.g. stored in a non-volatile memory).

Figure 2:
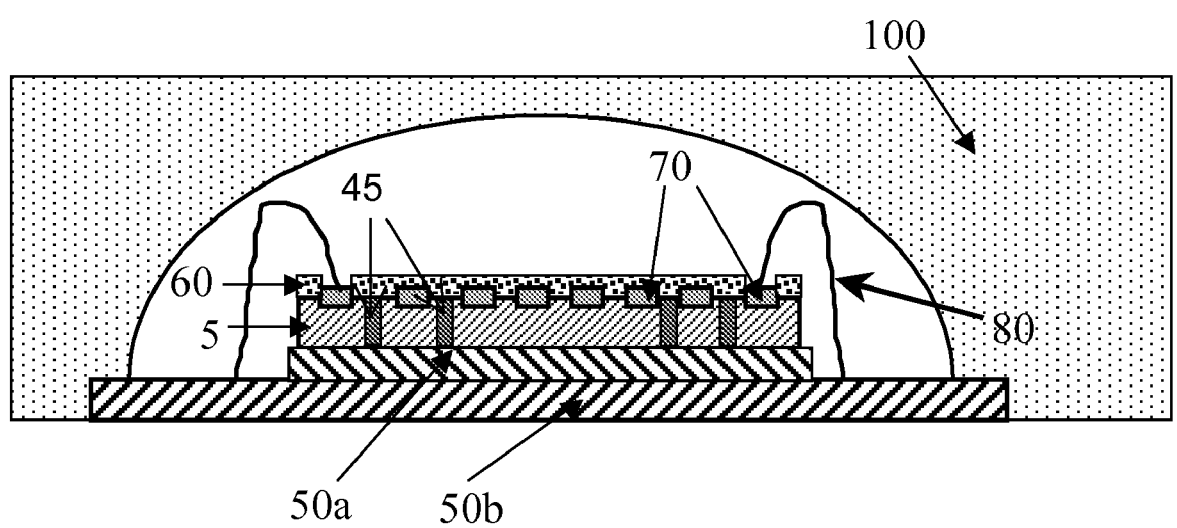
FIG. 2 shows a tamper-resistance semiconductor device according to a second embodiment of the invention.

FIG. 2 shows a tamper-resistant semiconductor device according to a second embodiment of the invention. This embodiment differs from the embodiment in FIG. 1a in that instead of providing a protection layer 50 on the backside of the substrate 5, the substrate 5 is mounted on an electrically-conductive substrate carrier 50b with an electrically-conductive adhesive layer 50a. In this way the adhesive layer 50a and the electrically-conductive substrate carrier 50b (which may be a leadframe in some embodiments) together form the protection layer. An attempt to remove the integrated circuit from its substrate carrier 50b results in a change in the resistance measured by the security circuit (not shown). The tamper-resistant semiconductor device in FIG. 2 is further provided with bond-pads 70 on its front-side which are connected to the substrate carrier 50b via bonding wires 80. Also, a passivation layer 60 may be provided over the semiconductor device having holes at locations of the bondpads 70 which are connected to the substrate carrier 50b. By way of an example application the assembly has been mounted into a plastic card 100 which is the case in smart-card applications for example.

An adhesive material may be rendered conductive by adding silver particles to it, which is commercially available as "Leitsilber". Another advantage of adding silver parts to an adhesive material is that a high concentration of silver particles renders the adhesive material optically opaque which renders optical inspection more difficult or even impossible.

In another embodiment of the tamper-resistant semiconductor device the electrically-conductive protection layer 50 is only formed by an adhesive layer 50a. In that case a substrate carrier 50b onto which the device is mounted need not be electrically conductive.

Figure 3A:
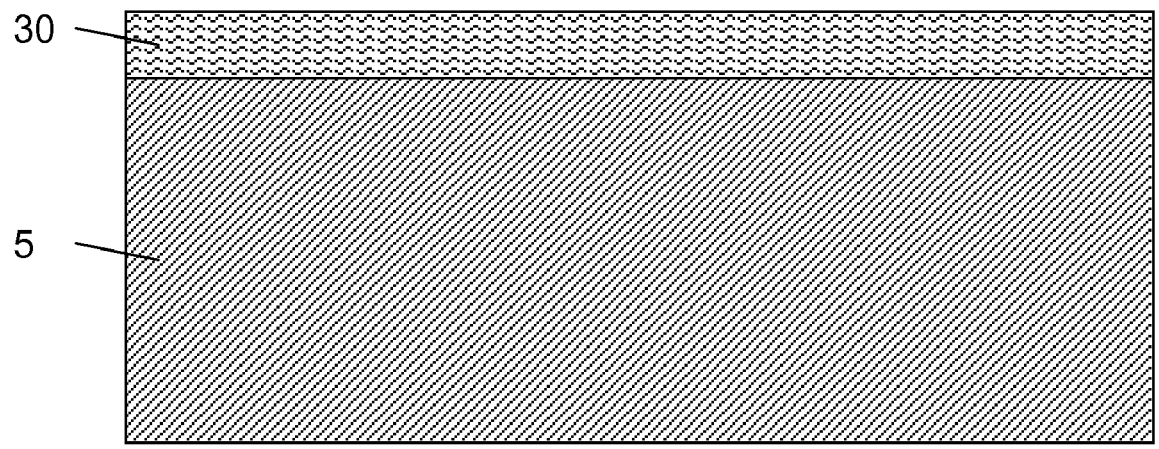
FIGS. 3a to 3f illustrate different stages in a manufacturing process for a tamper-resistant semiconductor device in accordance with the invention.
Figure 3B:
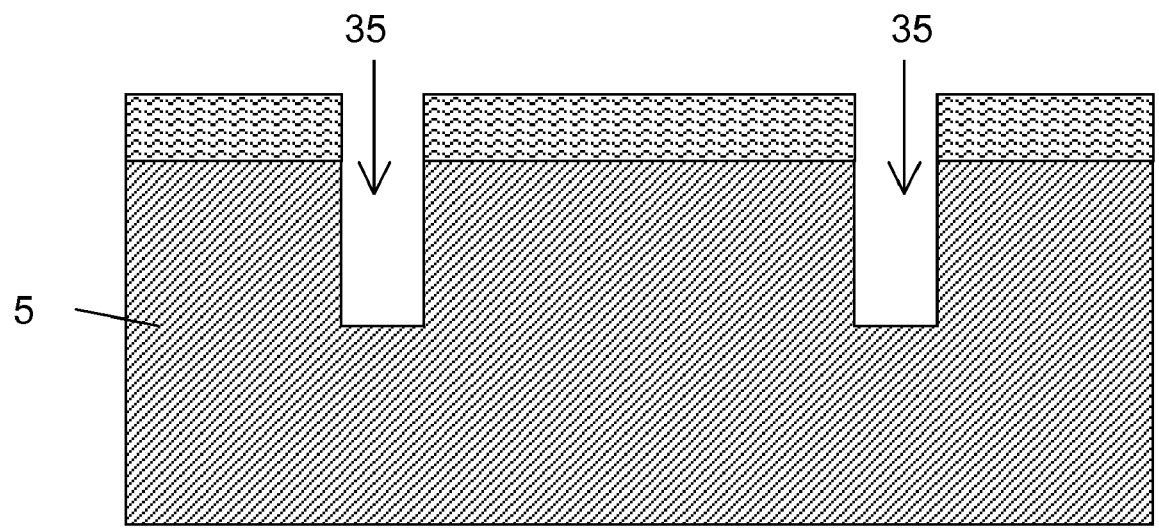
Figure 3C:
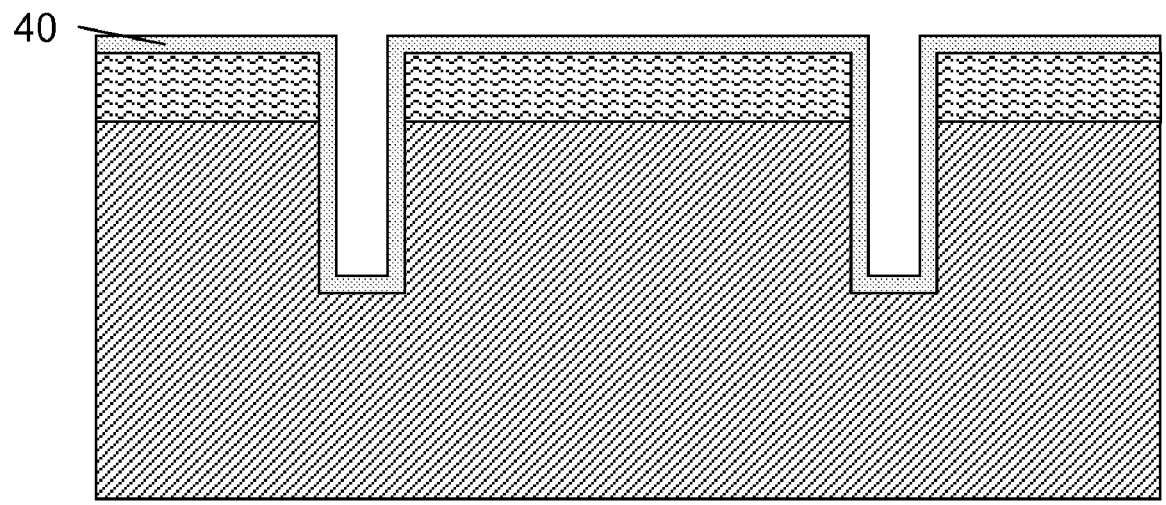
Figure 3D:
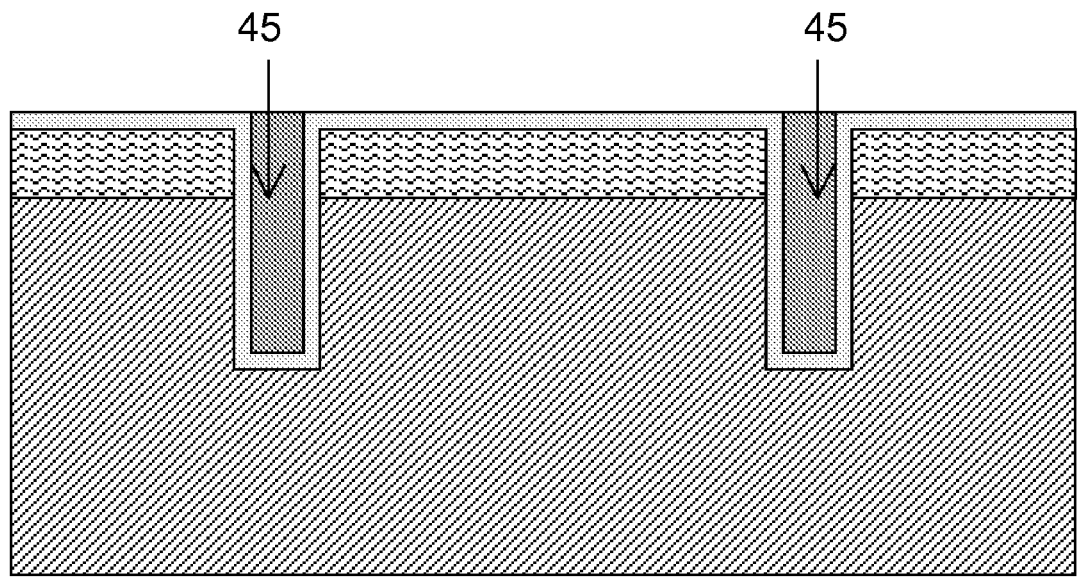
Figure 3E:
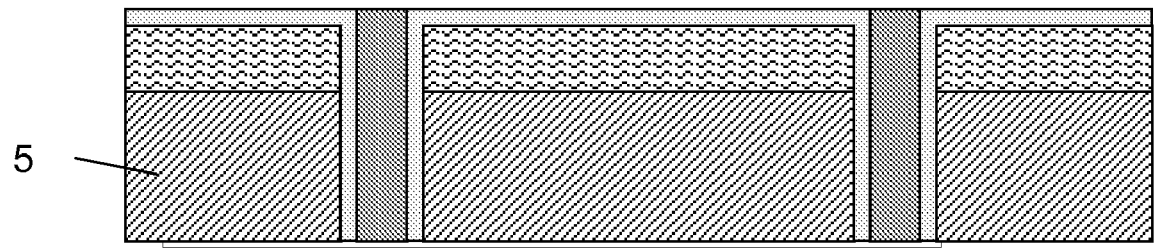
Figure 3F:
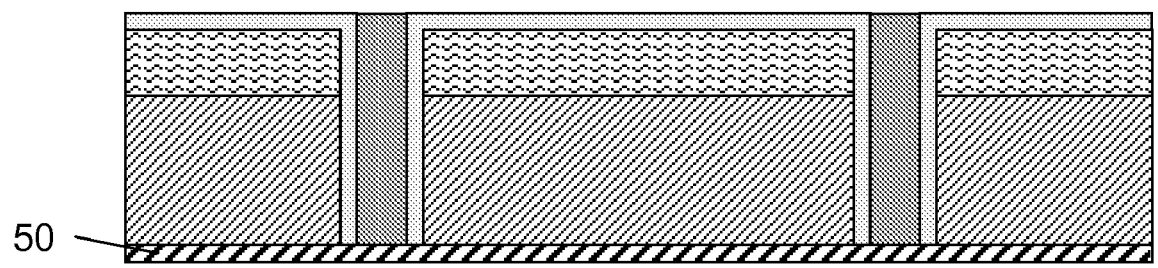

FIGS. 3a to 3f illustrate different stages in a manufacturing process for a tamper-resistant semiconductor device in accordance with the invention. What is described in the description of FIGS. 1a and 1b also applies to these Figures. FIG. 3a illustrates a stage of the process wherein a substrate 5 is provided having an electronic circuit (not shown) provided at a first side (front-side) thereof. The electronic circuit comprises secure information which needs to be protected against attacks. In this example an insulating layer 30 is provided over the electronic circuit. FIG. 3b illustrates a stage of the process wherein a plurality of openings is provided that extends from the first side through the insulating layer 30 into the substrate 5. In FIG. 3c a further insulating layer (e.g. silicon oxide) is provided that covers the first side of the substrate 5 and all sidewalls of the openings 35. In FIG. 3d the openings 35 are filled with electrically conductive material 45 for forming electrically conductive connections. In FIG. 3e the second-side (backside) of the substrate 5 is thinned down using known processing techniques which finalizes the formation of the through-substrate connections 45. In FIG. 3f the protection layer 50 is provided on the backside of the substrate 5 which as a consequence of the thinning-down step, makes electrical contact with the through-substrate connections 45. The protection layer 50 may be provided with sputtering, for example. Sputtering is well-known to the person skilled in the art.

In an alternative embodiment a thin electrically insulating layer (e.g. SiO2, Si3N4) is provided on the backside of the substrate 5 before providing the protection layer 50. In that case, the thin electrically insulating layer needs to be partially etched at the locations of the through-substrate connections 45 in order to realize an electrical connection to the protection layer 50.

After the stage illustrated in FIG. 3f generally various subsequent processing steps are performed in order to obtain a semiconductor device which may be mounted into its application. One of those steps is the provision of a passivation layer (not shown) over the complete semiconductor device. Such a passivation layer may comprise a first layer of 500 nm of silicon oxide (SiO2) with a second layer of 500 nm of silicon nitride (Si3N4).

Figure 4A:
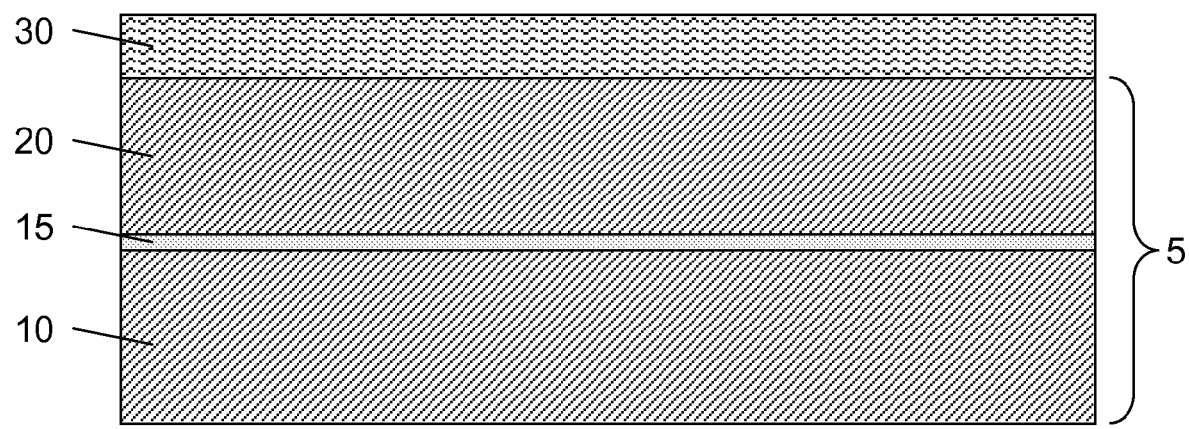
FIGS. 4a to 4f illustrate different stages in another manufacturing process for a tamper-resistant semiconductor device in accordance with the invention.
Figure 4B:
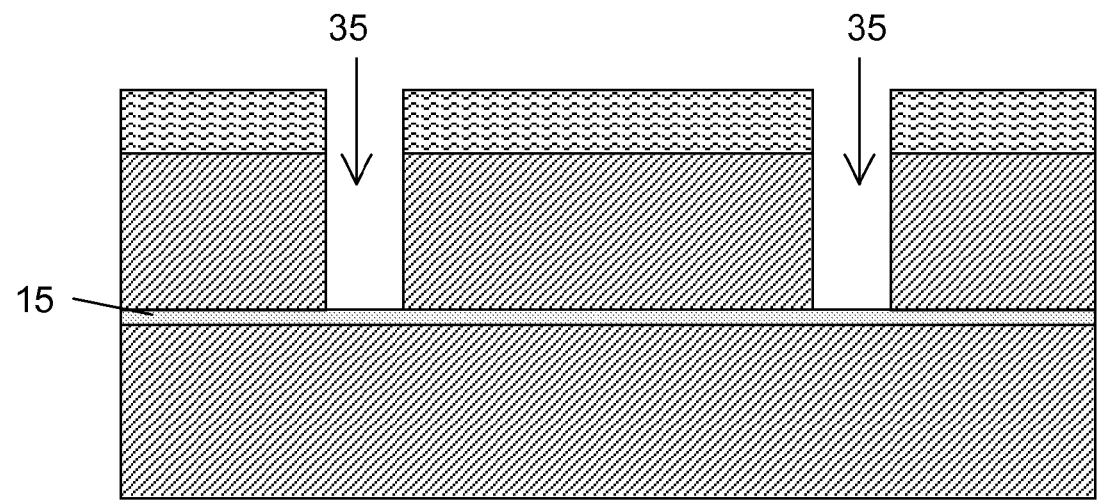
Figure 4C:
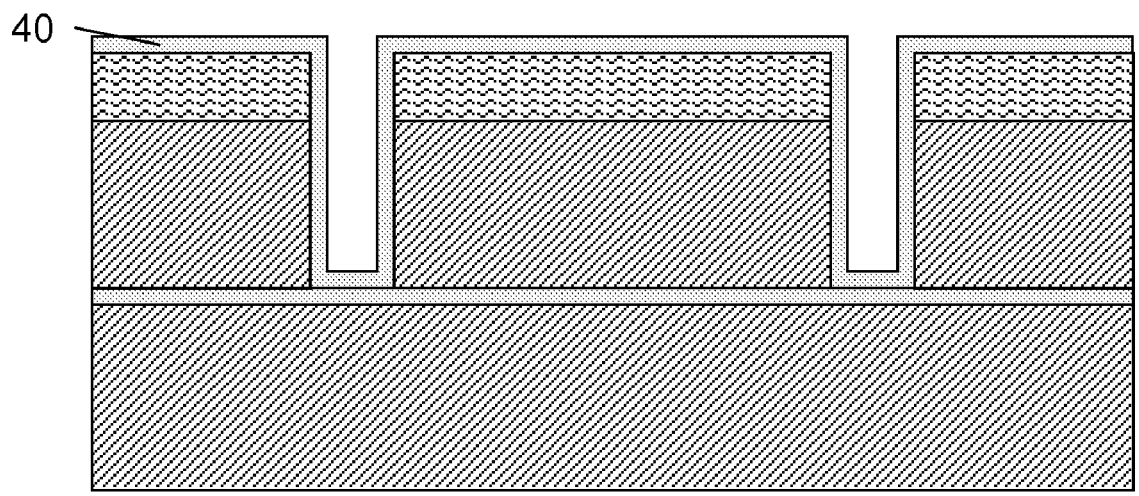
Figure 4D:
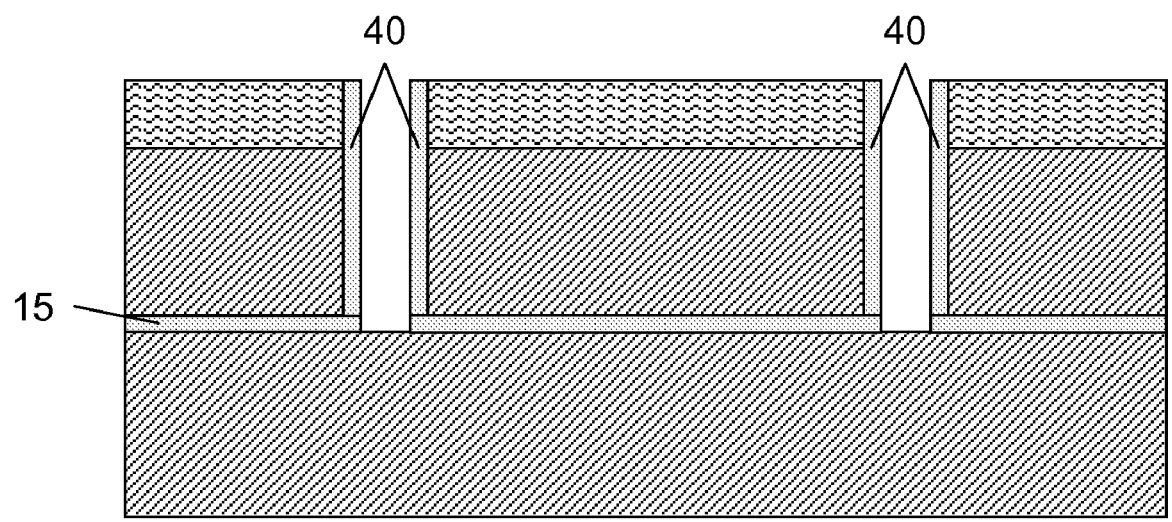
Figure 4E:
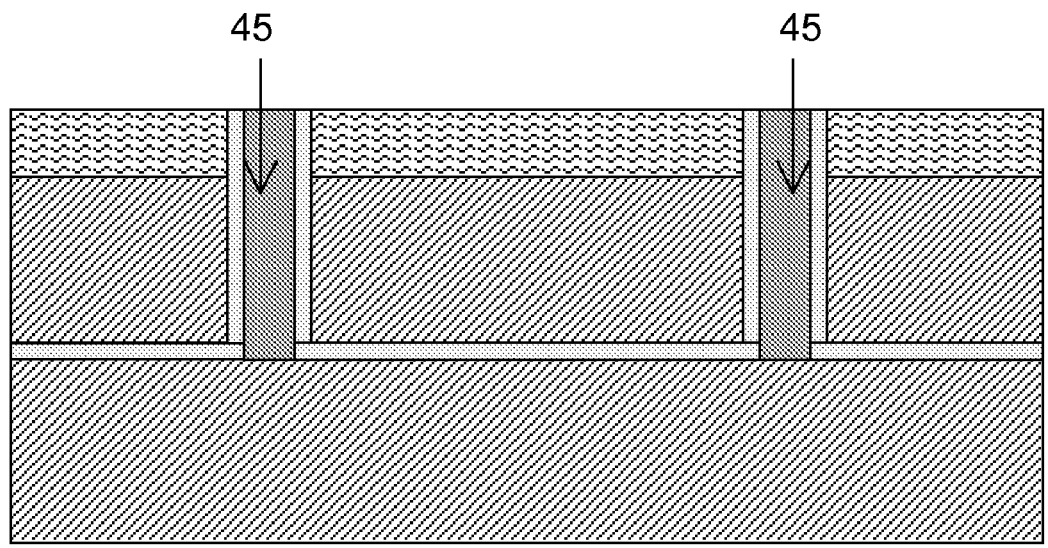
Figure 4F:
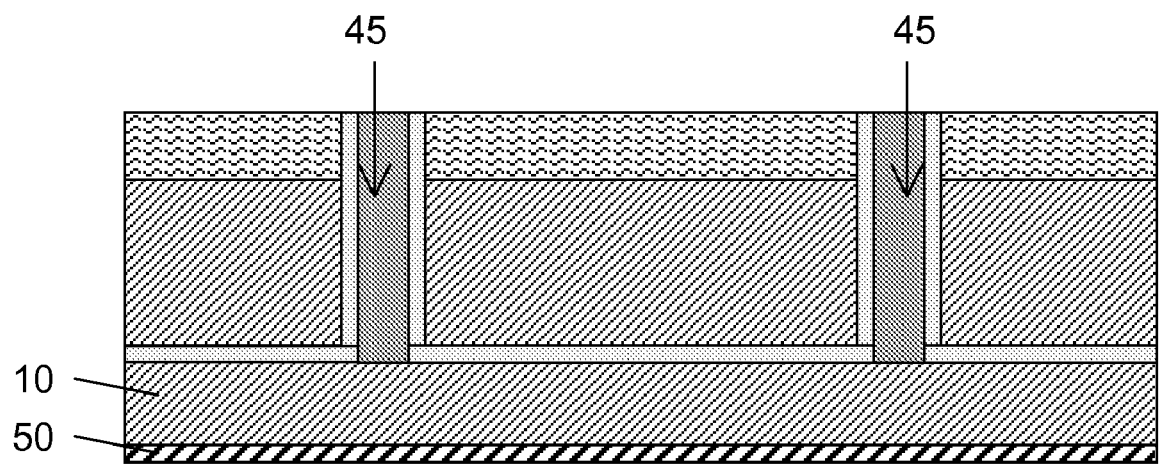

FIGS. 4a to 4f illustrate different stages in another manufacturing process for a tamper-resistant semiconductor device in accordance with the invention. This embodiment will be discussed only in as far as it differs from the embodiment disclosed in FIGS. 3a to 3f. In the stage of the process illustrated in FIG. 4a the substrate 5 comprises a silicon-on-insulator (SOI) substrate, which comprises a substrate layer 10, a buried-oxide layer 15 provided on top of the substrate layer 10, and an active layer 20 provided on top of the buried-oxide layer 15. The active layer 20 comprises the earlier described electronic circuit (not shown). In the stage of FIG. 4b the opening which is formed, extends to the buried oxide layer 15. In the stage illustrated in FIG. 4c an insulating layer 40 is provided similar as to the stage in FIG. 3c. In the stage illustrated in FIG. 4d an anisotropic etch is performed which removes the insulating layer 40 at the first side of the substrate 5 and at the bottom of the openings 35. In the stage illustrated in FIG. 4e the through-substrate connections 45 are provided similar as to FIG. 3d. The stage illustrated in FIG. 4f corresponds to FIGS. 3e and 3f. In this stage the substrate layer 10 of the substrate 5 has been thinned-down and a protection layer 50 is provided thereon.

This embodiment of the method is very advantageous, because it relies upon the fact that the substrate layer 10 of an SOI substrate 5 is generally a fairly good conducting layer. The through-substrate connections 45 therefore need not be extending completely through the substrate 5 to the protection layer 50. An extension towards the substrate layer 10 establishes a connection between the through-substrate connections 45. The resistance which is measured from the first side of the semiconductor device comprises some sort of parallel connection of the substrate-layer resistance and the protection layer resistance. It must be noted that the lower the resistance of the protection layer 50 with respect to the resistance of the substrate layer 10, the more a tampering of the protection layer will influence the measured resistance by the security circuit. The fact that the through-substrate connections 45 only need to extend from the first side to the substrate layer 10 means that the through-substrate connections (vias) 45 may be shorter. Given a specific process, the maximum achievable depth of an opening 35 (needed for the manufacturing of a through-substrate connection) depends on the aspect ratio of the opening 35, wherein the aspect ratio is defined as the depth of the opening 35 divided by the minimum lateral dimension of the opening 35. A shallower opening 35 may have a smaller lateral dimension, which may result in a chip area reduction, and indirectly a cost saving. An additional advantage of using an SOI substrate 5 is that, instead of making a through-substrate connection the substrate 5 does not always need to be thinned down as much as in the case of bulk substrates. This depends on the application: i.e. smart cards.

It must be noted that the manufacturing process illustrated in FIGS. 3a to 4f are examples only. The person skilled in the art may easily come up with variations of these methods.

Figure 5A:
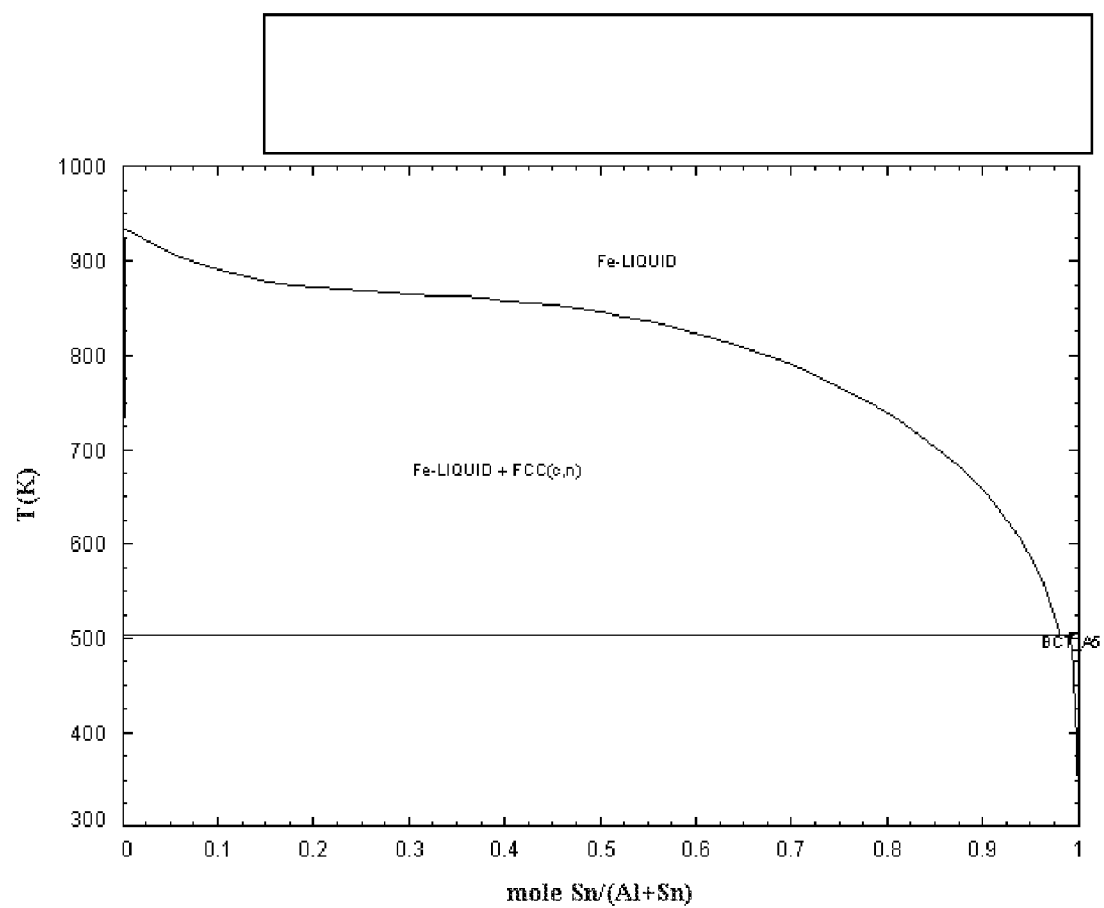
FIG. 5a shows a phase diagram of an aluminum-tin composition showing immiscibility.
Figure 5B:
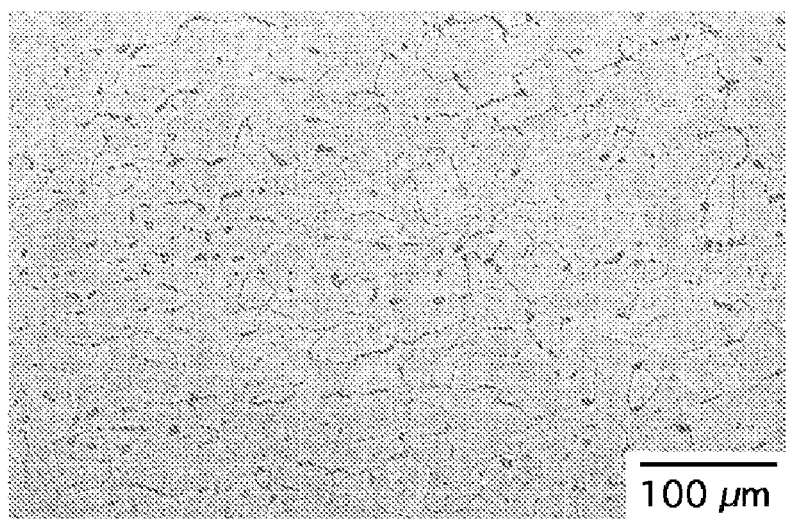
FIG. 5b shows an example of a microstructure of immiscible metals after heat treatment.

FIG. 5a shows a phase diagram of an aluminum-tin composition showing immiscibility and FIG. 5b shows an example of a microstructure of immiscible metals after heat treatment. An advantageous embodiment of the semiconductor device according to the invention is obtained if the conductivity of the protection layer 50 is not uniform over its entire area. Such an embodiment features the extraction of a device-specific key from the protection layer, which may be used for encryption purposes. One way of manufacturing a protection layer 50 with a variable conductivity over its area is to use a mixture of aluminum (Al) and tin (Sn). In this mixture inter-metal bonds are not formed. This is illustrated in the phase diagram of FIG. 5a. When a mixture of aluminum and tin is sputtered on a surface a layer of a homogenous atomic mixture of aluminum and tin is formed. When this layer is heated to about 250° C. the mixture will separate into aluminum and tin islands, the aluminum islands having a low resistance, and the tin islands having a high resistance. FIG. 5b shows a photo of a metal mixture having such separated islands. A consequence of the presence of these islands is that, when such a layer is used as a protection layer 50 as in the invention, the conductive path between through-substrate connections has become variable, and above that unpredictable.

Figure 6:
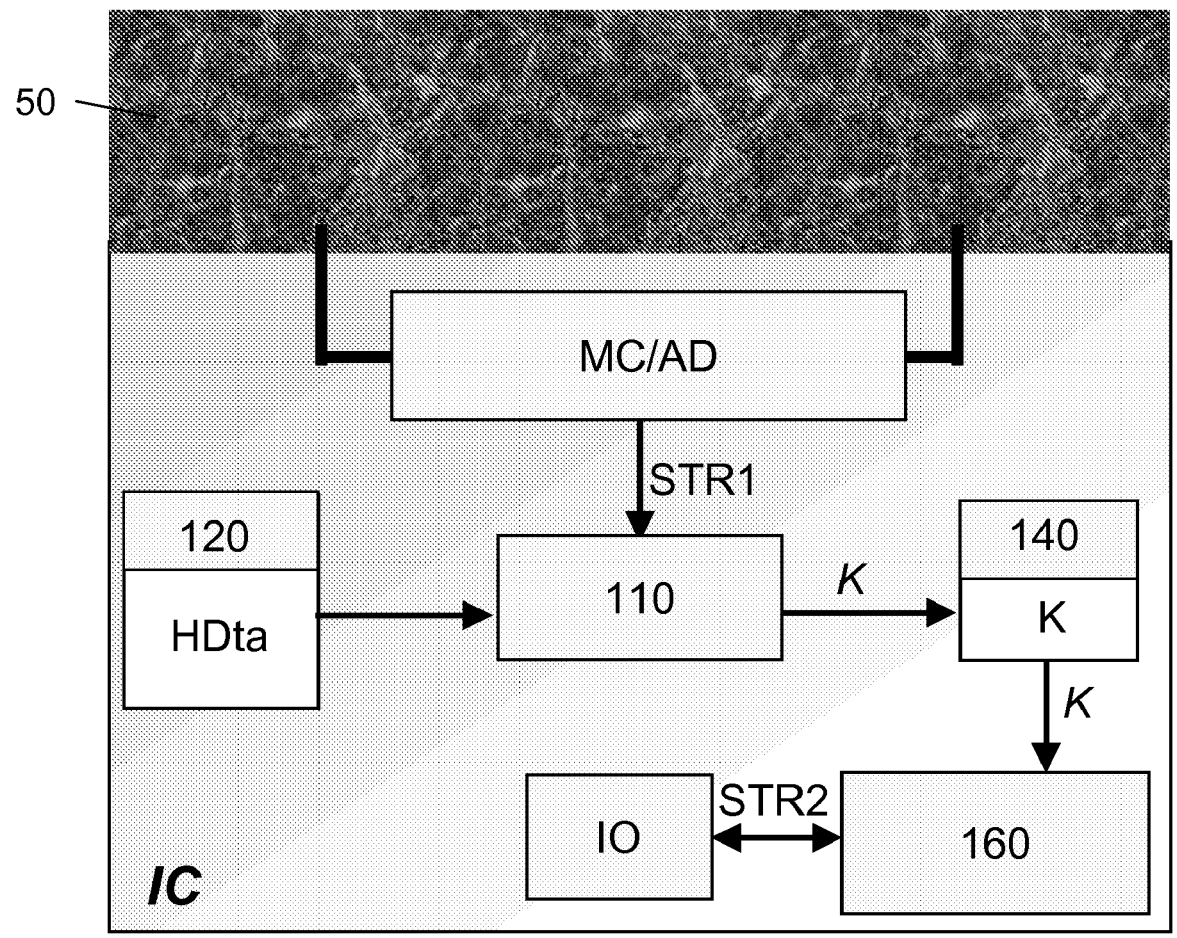
FIG. 6 shows an example of a possible system that benefits from the tamper-resistant semiconductor device of the invention.

FIG. 6 shows an example of a possible system that benefits from the tamper-resistant semiconductor device of the invention. Traditionally, secret chip identifiers or keys are programmed and stored in non-volatile memories like EEPROM or fuse memories. Data stored on those memories is not secure and can be read out using analyzing techniques. To overcome this it is proposed to derive (at least part of) an encryption key from the protection layer properties on the backside. A possible system implementing this is illustrated in FIG. 6 and operates as follows. On system request the resistances of the protection layer 50 are measured by a measurement circuit MC and converted into digital bit-string(s) STR1 by an analog-to-digital converter AD. The measurement circuit MC and the analog-to-digital converter AD are shown as one block MC/AD in FIG. 6. Together with helper data HDta (and optionally more secret key data) from an EEPROM 120, this string STR1 is converted into an encryption key K that is temporarily stored in a register 140. This register 140 can be e.g. a SRAM or flip-flops in random logic. A crypto processor 160 converts this data into an output bit-string STR2 that is communicated to the outside world via an input-output interface IO. After this conversion is done the key is deleted form the memory 140. For a smart card application, the system described above means the following.

The secret key is never transmitted but rather a hash function of the key. This hash function is dependent of a request by the bank to the smart card which avoids that the same string is send always. In the bank the information is stored in a secure way. Hence, it is 'impossible' to retrieve the secret key from the transmitted string.

The invention thus provides, in a first aspect, a tamper-resistant semiconductor device which comprises backside protection which may be easily manufactured using conventional backside processing techniques. All that is needed is an electrically-conductive protection layer on the backside of the device and at least three through-substrate electrically-conductive connections extending from the front-side into the substrate and in electrical contact with the protection layer. By doing so, the security circuit arranged on the front-side of the device may measure at least two resistance values on the single one-piece protection layer, whereas in the prior art complexly patterned protection layers are manufactured for providing a plurality of different resistances. In the semiconductor device according to the invention tampering of the protection layer may be detected because at least one of the measured resistance values may change because of the tampering. Once tampering has been detected secure data stored in an electronic circuit in the device may be erased, which renders it impossible for a hacker to obtain the data.

The invention provides, in a second aspect, methods of manufacturing a tamper-resistant semiconductor device. A first embodiment of the method comprises the use of a bulk-substrate and a second embodiment comprises the use of a SOI-substrate. The latter embodiment has as an advantage that the through-substrate connections need to extend that deep into the substrate, or that the wafer may be thinned-down to as less extend. This is based on the insight that a substrate layer of the SOI-substrate is generally a conductive layer as well. An electrical contact between the through-substrate connections and the protection layer is then obtained by the substrate layer.

Various variations of semiconductor device and the method of manufacturing in accordance with the invention are possible and do not depart from the scope of the invention as claimed. A few examples are summed up below.

Instead of changing the materials used in the protection layer 50, the layer could be manufactured with a variable thickness. Alternatively, it could be provided with randomly distributed particles having a different resistance or with randomly distributed gaps.

The tamper-resistance of the semiconductor device according to the invention is further improved if the resistance of the through-substrate connections 45 has a distributed or random conductivity. If a hacker manages to determine and reproduce the properties of the protection layer 50 he has effectively made a circumvention for the protection. However, when the through-substrate connections 45 have a distributed or random conductivity, it has been rendered impossible for the hacker to apply measured properties from one device to another. As a consequence, a higher security level is obtained.

One method of manufacturing through-substrate connections 45 having variable conductivity is to manufacture them with variable diameter or length. In an alternative method a cleaning step (which is often done) after the step of thinning down may be dispensed with, which then results in a contact resistance to the protection layer 50 which varies and which shows random behavior.

The invention provides for a backside protection of the semiconductor device which may be easily manufactured using conventional backside processing techniques. The invention further relates to methods of manufacturing a tamper-resistant semiconductor device. The invention may be applied in various applications: smart cards, SIM cards mobile phones, RFID's and basically all applications that require a secure IC like value paper, identification, medicines, and content industry.

The invention claimed is:

1. A tamper-resistant semiconductor device comprising:
   a semiconductor substrate comprising an electronic circuit arranged on a first side thereof;
   the semiconductor device having an electrically-conductive productive protection layer arranged on a second side of the semiconductor substrate opposite to the first side;
   at least three through-substrate electrically-conductive connections extending from the first side of the semiconductor substrate into the semiconductor substrate and in electrical contact with the electrically-conductive protection layer on the second side of the substrate;
   a security circuit being arranged on the first side connected to the through-substrate electrically-conductive connections and being arranged
   i) for measuring at least two resistance values of the electrically-conductive protection layer through the through-substrate electrically-conductive connections to provide a security code, and
   ii) for comparing the security code with a reference code.

2. Tamper-resistant semiconductor device as claimed in claim 1, wherein the semiconductor substrate comprises a Silicon-on-Insulator substrate (an SOI-substrate), the SOI-substrate comprising a semiconductor substrate layer, a buried-oxide layer provided on the substrate layer, and an active layer provided on the buried-oxide layer, the active layer being located at the first side of the substrate and the semiconductor substrate layer being located at the second side of the semiconductor substrate, the electronic circuit being provided in the active layer, wherein the through-substrate connections extend from the first side through the active layer and the buried-oxide layer to the semiconductor substrate layer, and wherein the electrically-conductive protection layer is provided on the semiconductor substrate layer at the second side of the semiconductor substrate.

3. Tamper-resistant semiconductor device as claimed in claim 1, wherein the semiconductor substrate is mounted at its second side on an electrically-conductive semiconductor substrate carrier via an electrically-conductive adhesive layer, wherein the electrically-conductive semiconductor substrate carrier and the electrically-conductive adhesive layer together form the electrically-conductive protection layer.

4. Tamper-resistant semiconductor device as claimed in claim 1, wherein the electrically-conductive protection layer and the through-substrate connections form a region covering a part of the second side of the semiconductor substrate.

5. Tamper-resistant semiconductor device as claimed in claim 4, wherein the protection layer is patterned to form said region, and through-substrate connections designed for signal transmission or grounding, are present outside the region.

6. Tamper-resistant semiconductor device as claimed in claim 1, wherein the electrically-conductive protection layer fully covers the second side of the substrate.

7. Tamper-resistant semiconductor device as claimed in claim 1, wherein the number of through-substrate connections equals n, $n \geq 3$, and the number of resistance values measured between pairs of the through-substrate connections equals Z, wherein Z complies with the following equation:

$$2 < Z \leq (n!/((n-2)! * 2!)).$$

8. Tamper-resistant semiconductor device as claimed in claim 1, wherein the security circuit comprises a circuit selected from the group comprising:
   a two-point resistance-measurement circuit, and
   a four-point resistance-measurement circuit.

9. Tamper-resistant semiconductor device as claimed in claim 1, wherein neighboring first and a second through-substrate connections are mutually located at a first distance, while neighboring first and third through-substrate connections are located at a second distance unequal to the first distance.

10. Tamper-resistant semiconductor device as claimed in claim 9, wherein a further pair of neighboring through-substrate connections is mutually located at the first distance and the circuit is arranged for use of the further pair as a reference to the pair of the first and second through-substrate connections.

11. Tamper-resistant semiconductor device as claimed in claim 9, wherein the electrically-conductive protection layer comprises a mixture of tin (Sn) and aluminum (Al).

12. Tamper-resistant semiconductor device as claimed in claim 1, wherein the security circuit further comprises a security element at a first side of the semiconductor substrate.

13. Tamper-resistant semiconductor device as claimed in claim 1, wherein the electrically-conductive protection layer comprises a composition or material which provides for a pseudo-random or fully-random variable spatial conductivity.

14. Tamper-resistant semiconductor device as claimed in claim 1, where the semiconductor device further comprises at least one light-emitting device and at least one light-sensing device provided on the first side of the semiconductor device, wherein the light-emitting device is arranged to emit light, including a wavelength range for which the substrate is transparent, into the semiconductor substrate towards the second side; and wherein the light-sensing device is arranged to sense at least a fraction of the emitted light following passage through the substrate and reflection at the second side, and configured to output a signal indicative of a reflecting state of the second side, thereby enabling detection of an attempt to tamper with the second side of the semiconductor device.

15. Method of manufacturing a semiconductor device as claimed in claim 1, the method comprising steps of:

providing a Silicon-on-Insulator semiconductor substrate (an SOI-semiconductor substrate), the SOI-semiconductor substrate comprising a semiconductor substrate layer, a buried-oxide layer provided on the substrate layer, and an active layer provided on the buried-oxide layer, the active layer being located at the first side of the semiconductor substrate and the semiconductor substrate layer being located at the second side of the semiconductor substrate;

providing the electronic circuit on the first side of the substrate in the active layer;

providing the at least three through-substrate electrically-conductive connections in the semiconductor substrate, the connections extending from the first side of the substrate to the semiconductor substrate layer, and providing the security circuit on the first side, and connecting the circuit to the through-substrate electrically-conductive connections, the security circuit being arranged i) for measuring at least two resistance values of the electrically-conductive protection layer through the through-substrate electrically-conductive connections, and ii) for comparing the measured resistance values with reference resistance values;

providing the electrically-conductive protection layer on the second side of the substrate.

16. A method of authenticating the device of claim 1, comprising:

i) measuring at least two resistance values the electrically-conductive protection layer through the through-substrate electrically-conductive connections to provide a security code, and ii) comparing the security code with a reference code.

17. The method as claimed in claim 16, wherein the measuring involves a relative measurement of resistance values.

18. An identification article comprising a tamper-resistant semiconductor device the tamper-resistant semiconductor device comprising:

a semiconductor substrate comprising an electronic circuit arranged on a first side thereof;

the semiconductor device having an electrically-conductive productive protection layer arranged on a second side of the semiconductor substrate opposite to the first side;

at least three through-substrate electrically-conductive connections extending from the first side of the semiconductor substrate into the semiconductor substrate and in electrical contact with the electrically-conductive protection layer on the second side of the substrate;

a security circuit being arranged on the first side connected to the through-substrate electrically-conductive connections and being arranged i) for measuring at least two resistance values of the electrically-conductive protection layer through the through-substrate electrically-conductive connections to provide a security code, and ii) for comparing the security code with a reference code.

19. Method of manufacturing a semiconductor device as claimed in claim 1, the method comprising steps of:

providing the semiconductor substrate having the first side and the second side opposite to the first side;

providing the electronic circuit on the first side of the semiconductor substrate;

providing the at least three through-substrate electrically-conductive connections in the semiconductor substrate, the connections extending from the first side of the substrate to the second side of the substrate, and providing the security circuit on the first side, and connecting the circuit to the through-substrate electrically-conductive connections, the security circuit being arranged i) for measuring at least two resistance values of the electrically-conductive protection layer through the through-substrate electrically-conductive connections, and ii) for comparing the measured resistance values with reference resistance values providing the electrically-conductive protection layer on the second side of the substrate.

20. A method of authenticating the article of claim 18, comprising the steps of:

i) measuring at least two resistance values of the electrically-conductive protection layer through the through-substrate electrically-conductive connections to provide a security code, and ii) comparing the security code with a reference code.

21. The method of claim 20, wherein the measuring involves a relative measurement of resistance values.

* * * * *